United States Patent [19]

Pan

[11] Patent Number: 5,672,544
[45] Date of Patent: Sep. 30, 1997

[54] METHOD FOR REDUCING SILICIDED POLY GATE RESISTANCE FOR VERY SMALL TRANSISTORS

[76] Inventor: Yang Pan, 60 Woodlands Industrial Park D, Street 2, Singapore, Singapore, 738406

[21] Appl. No.: 635,827

[22] Filed: Apr. 22, 1996

[51] Int. Cl.$^6$ .................................................. H01L 21/28
[52] U.S. Cl. ........................... 437/200; 437/192; 437/193; 257/900
[58] Field of Search .................... 437/41, 192, 193, 437/200, 228; 257/900

[56] References Cited

U.S. PATENT DOCUMENTS

| | | | |
|---|---|---|---|
| 5,102,815 | 4/1992 | Sanchez | 437/192 |
| 5,200,352 | 4/1993 | Pfiester | 437/41 |
| 5,401,676 | 3/1995 | Lee | 437/200 |
| 5,451,532 | 9/1995 | Bashir et al. | 437/200 |
| 5,491,099 | 2/1996 | Hsu | 437/200 |

*Primary Examiner*—John Niebling
*Assistant Examiner*—Thomas G. Bilodeau
*Attorney, Agent, or Firm*—George O. Saile; Rosemary L. S. Pike

[57] ABSTRACT

A method for reducing resistance in the fabrication of a silicided polysilicon gate for a very small transistor integrated circuit device is described. A polysilicon layer is deposited overlying a gate silicon oxide layer. The polysilicon and gate oxide layers are etched away where they are not covered by a mask to form a gate electrode. Ions are implanted to form source and drain regions within the semiconductor substrate using the gate electrode as a mask. A dielectric layer is deposited overlying the semiconductor substrate and the gate electrode. The dielectric layer is anisotropically etched to leave first spacers on the sidewalls of the gate electrode. The first spacers are isotropically etched back to leave second spacers extending approximately halfway up on the sidewalls of the gate electrode. A layer of titanium is conformally deposited over the surfaces of the substrate. The substrate is annealed whereby the titanium layer is transformed into a titanium silicide layer. The unreacted titanium on the oxide spacers is etched back to leave the titanium silicide layer only on the top surface and the sidewalls of the gate electrode not covered by the second spacers and overlying the source and drain regions. A second annealing transforms the titanium silicide to a phase of lower resistance. An insulating layer is blanket deposited over the substrate. Metallization with electrical connections is provided to complete the fabrication of the integrated circuit device.

20 Claims, 5 Drawing Sheets

METHOD FOR REDUCING SILICIDED POLY GATE RESISTANCE FOR VERY SMALL TRANSISTORS

BACKGROUND OF THE INVENTION

(1) Field of the Invention

The invention relates to the fabrication of integrated circuit devices, and more particularly, to a method of reducing resistance of a silicided gate especially for very small transistors in the fabrication of integrated circuits.

(2) Description of the Prior Art

In the fabrication of integrated circuits, when devices are scaled down, the resistance of a silicided gate will be increased. When the polysilicon gate becomes narrower than about 0.25 µm, it is considerably more difficult for the phase transfer of titanium silicide from C49 to C54. Titanium silicide C54 has a low resistivity. Because the phase transfer is not complete for very small devices, there is increased resistance. The increased resistance limits the resistance and capacitance (RC) delay at the gate level. A larger RC constant results in a longer time for charging and discharging. With a reduced RC constant, circuit speed will be improved. Therefore, it is desired to form a silicided polysilicon gate with reduced resistance, especially for very small transistors; that is less than about 0.25 µm in size.

U.S. Pat. No. 5,401,676 to Lee shows a technique for depositing titanium or the like on a silicon emitter tip and heating to form titanium silicide.

SUMMARY OF THE INVENTION

A principal object of the present invention is to provide an effective and very manufacturable method of fabricating a silicided polysilicon gate in the fabrication of an integrated circuit.

A further object of the invention is to provide a method of reducing resistance in the fabrication of a silicided polysilicon gate.

Yet another object is to provide a method of reducing resistance in the fabrication of a high aspect ratio silicided polysilicon gate.

Yet another object is to provide a method of reducing resistance in the fabrication of a silicided polysilicon gate for a very small transistor integrated circuit device.

In accordance with the objects of this invention a method for reducing resistance in the fabrication of a silicided polysilicon gate for a very small transistor integrated circuit device is achieved. A layer of gate silicon oxide is grown over the surface of a semiconductor substrate. A polysilicon layer is deposited overlying the gate silicon oxide layer. The polysilicon and gate oxide layers are etched away where they are not covered by a mask to form a gate electrode. Source/drain ions are implanted to form source and drain regions within the semiconductor substrate using the gate electrode as a mask. A dielectric layer is deposited overlying the semiconductor substrate and the gate electrode. The dielectric layer is anisotropically etched to leave first spacers on the sidewalls of the gate electrode. The first spacers are isotropically etched back to leave second spacers extending approximately halfway up on the sidewalls of the gate electrode. A layer of titanium is conformally deposited over the surfaces of the semiconductor substrate. The substrate is annealed whereby the titanium layer is transformed into a titanium silicide layer. The unreacted titanium on the oxide spacer is etched back to leave the titanium silicide layer only on the top surface and the sidewalls of the gate electrode not covered by the second spacers and overlying the source and drain regions. A second annealing transforms the titanium silicide to a phase of lower resistance. An insulating layer is deposited over the surface of the semiconductor substrate covering the gate electrode. Metallization with electrical connections is provided to complete the fabrication of the integrated circuit device.

Also in accordance with the objects of this invention, an integrated circuit device having a silicided polysilicon gate with reduced resistance is achieved. The integrated circuit device of the present invention comprises a polysilicon gate electrode on the surface of a semiconductor substrate, source and drain regions within the semiconductor substrate adjacent to the polysilicon gate electrode, dielectric spacers on the sidewalls of the gate electrode wherein the spacers extend halfway up the sidewalls of the gate, a silicide layer on the top surface of the gate electrode and on the sidewalls of the gate electrode not covered by the spacers and on the surface of the semiconductor substrate overlying the source and drain regions, an insulating layer overlying the polysilicon gate electrode and the semiconductor substrate, and a patterned conducting layer contacting the source and drain regions through openings in the insulating layer and the silicide layer to complete electrical connections in the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
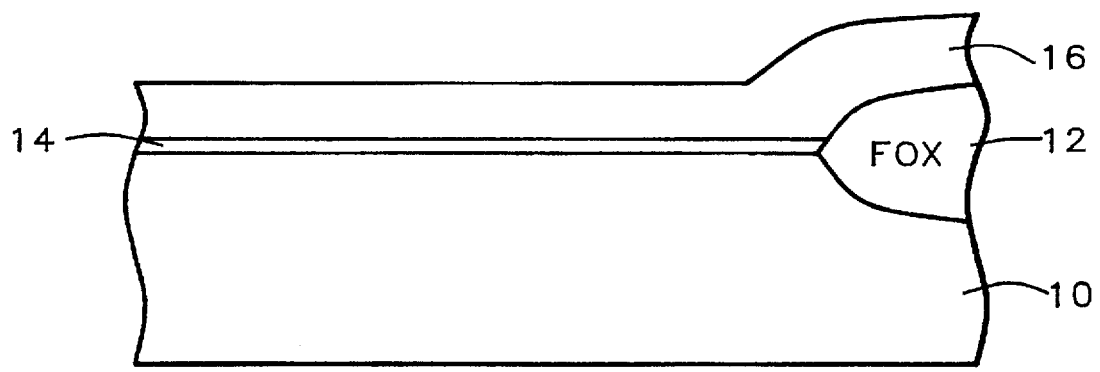
FIGS. 1 through 8 schematically illustrate in cross-sectional representation a preferred embodiment of the present invention.

Referring now more particularly to FIG. 1, there is shown an illustration of a portion of a partially completed integrated circuit. The semiconductor substrate 10 is preferably composed of silicon having a (100) crystallographic orientation. Field Oxide regions 12 are formed as are conventional in the art. The surface of the silicon substrate 10 is thermally oxidized to form the gate oxide layer 14.

Next, a layer of polysilicon 16 is deposited, for example, by low pressure chemical vapor deposition (LPCVD) to a suitable thickness of between about 1000 to 4000 Angstroms.

Figure 2:
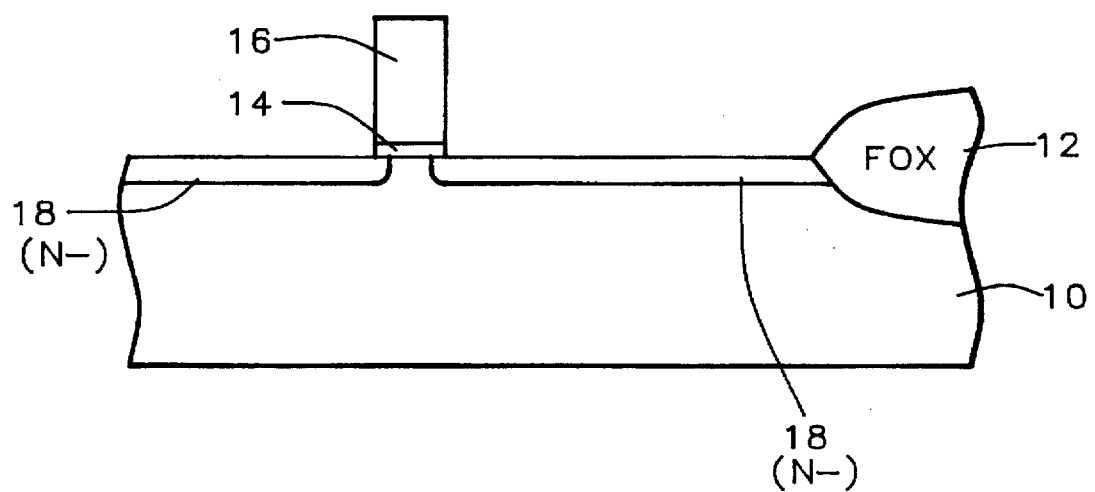

The polysilicon and gate oxide layers are etched away where they are not covered by a mask to provide a polysilicon gate electrode, as illustrated in FIG. 2. The gate electrode may be of a high aspect ratio, as high as 1 to 2. The process of the present invention can be used for very small scale transistors, less than about 0.25 µm.

Lightly doped source and drain regions 18 are formed by ion implantation, as is conventional in the art.

Figure 3:
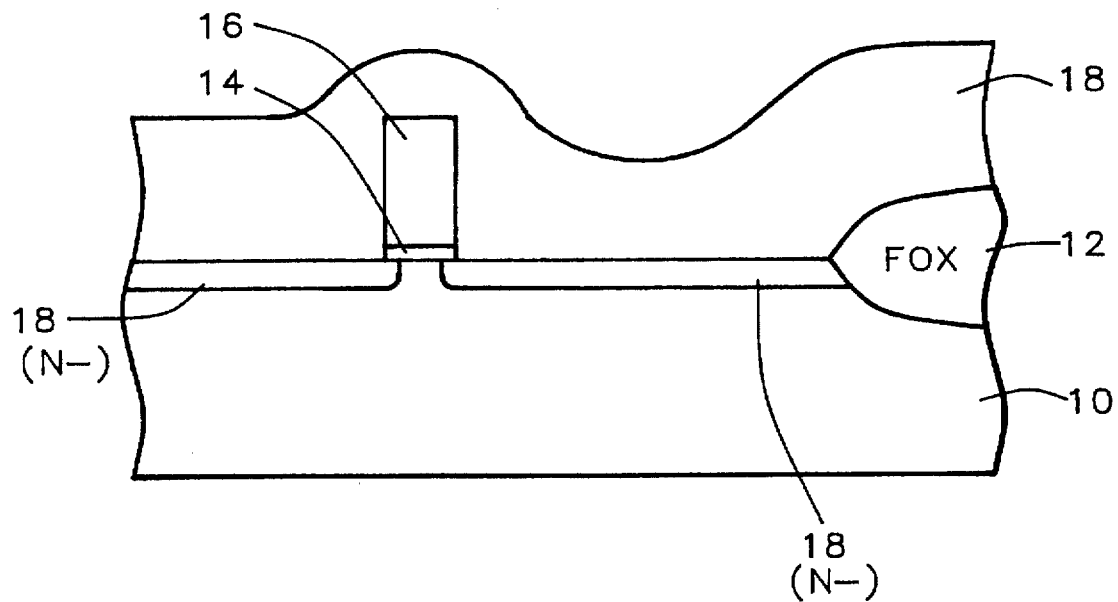
Figure 4:
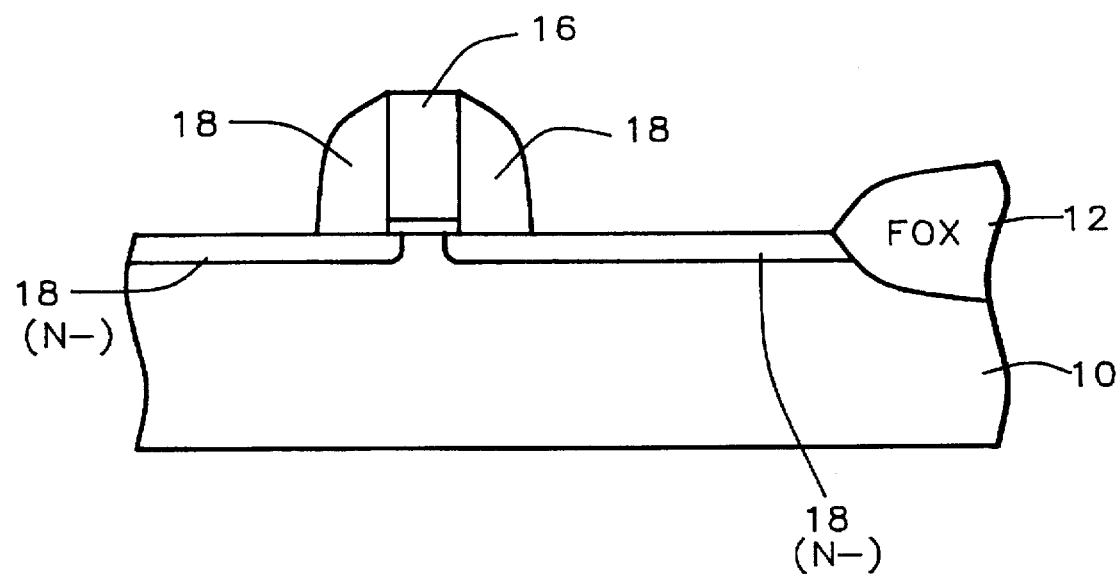

Referring now to FIG. 3, a dielectric layer 20 is deposited over the gate electrode and the surface of the substrate to a thickness of between about 1000 to 3000 Angstroms. The dielectric layer may be composed of tetraethoxysilane (TEOS), silicon nitride, or fluorine-TEOS.

The dielectric layer 20 is anisotropically etched to leave thick spacers, of between about 500 to 2500 Angstroms wide, on the sidewalls of the gate electrode.

Figure 5:
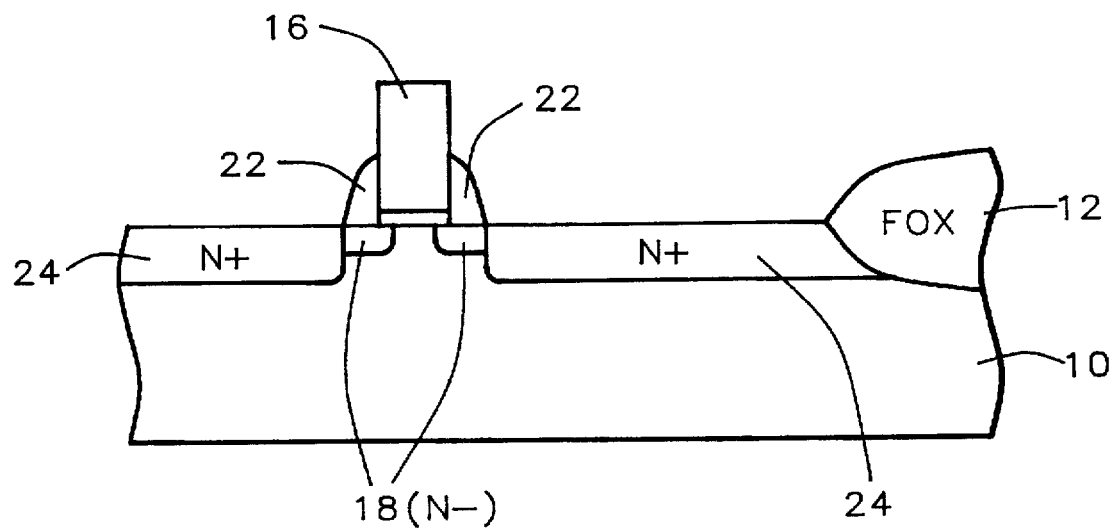

The thick spacers 20 are isotropically etched back approximately half the height of the gate. The resulting etched back spacers 22 are illustrated in FIG. 5. Heavily doped source and drain regions 24 are formed within the semiconductor substrate, typically by arsenic ion implant.

Figure 6:
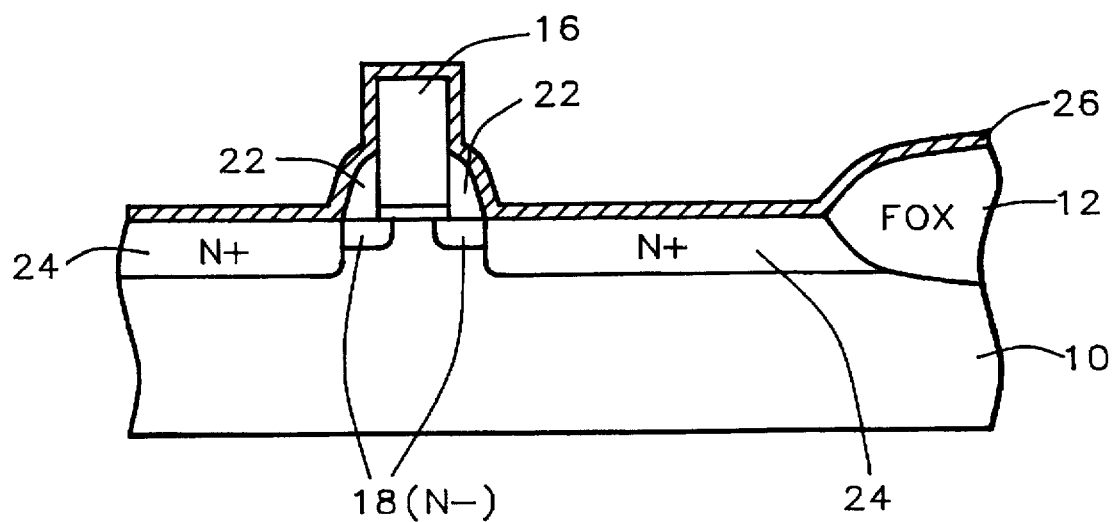

Now the silicided polysilicon gate of the present invention will be formed. A layer of titanium 26 is deposited conformally over the semiconductor substrate, as shown in FIG. 6, to a thickness of between about 250 to 1000 Angstroms. Alternatively, layer 26 could be composed of a titanium nitride/titanium stack, copper, or nickel.

Figure 7:
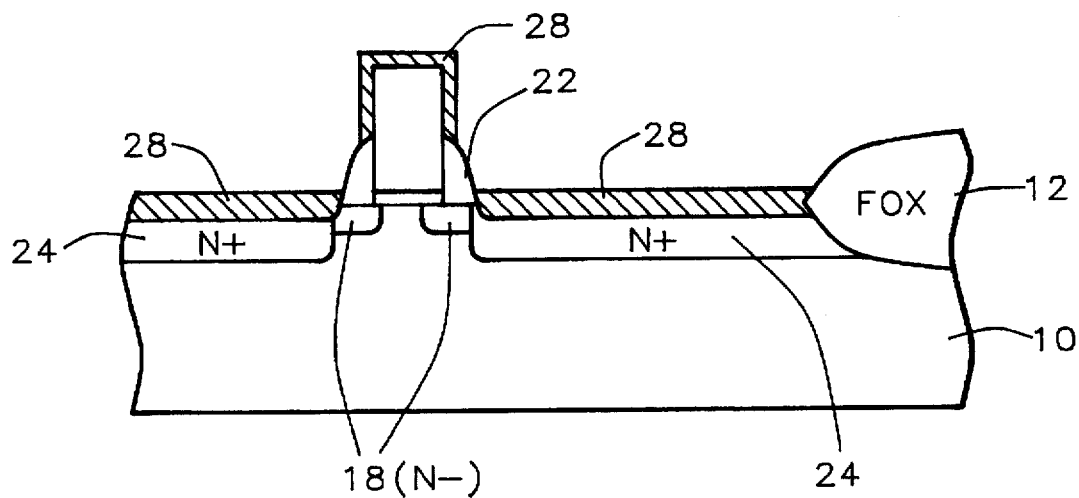

The titanium layer 26 is transformed to titanium silicide 28 by a thermal annealing cycle. This is preferably a rapid thermal anneal (RTA) at a temperature of between about 600° to 800° C. for between about 10 to 30 seconds in a nitrogen ambient. After the thermal reaction, the titanium in contact with the silicon substrate or with the polysilicon will form titanium silicide, $TiSi_2$. The titanium on top of the oxide spacer 22 will not be heated. This remaining unreacted titanium can be etched away using, for example, a solution of $NH_4OH$: $H_2O_2$: $H_2O$, resulting in FIG. 7.

In the conventional process, the titanium silicide is formed only on the top surface of the polysilicon gate. Because of the spacer etchback process of the present invention, titanium silicide is also formed on the upper sidewall surfaces of the gate. This increases the effective titanium silicide conduction area.

After the unreacted titanium is stripped, a second RTA is used to transform the titanium silicide from C49 to the low resistivity C54 phase. This annealing is performed at a temperature of between about 800° to 900° C. for between about 10 to 30 seconds in a nitrogen ambient.

Figure 8:
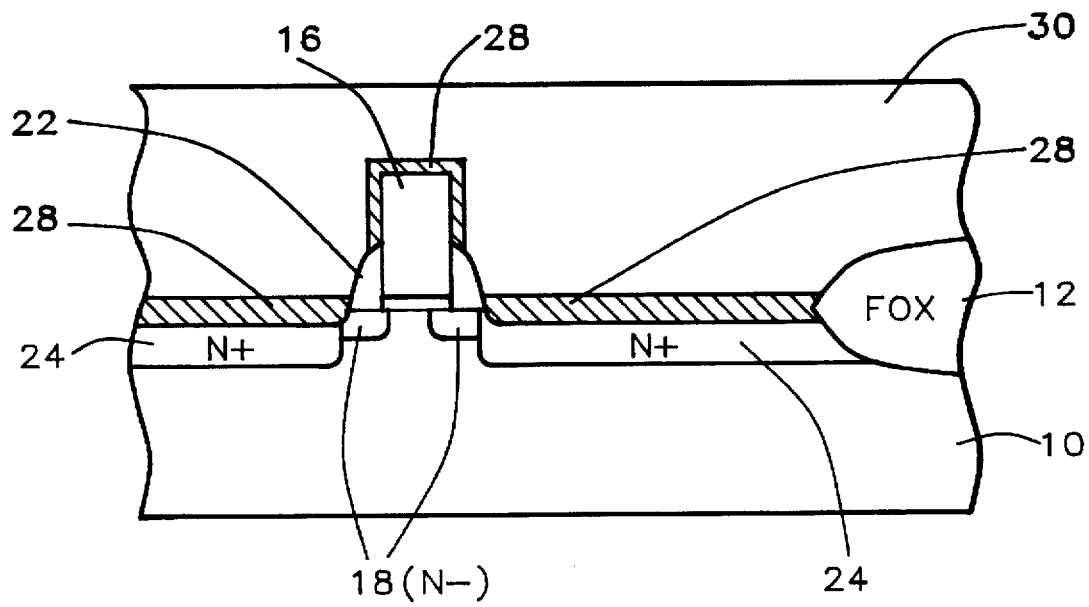

Referring to FIG. 8, an insulating layer, such as silicon oxide or borophospho-TEOS (BPTEOS) 30 is blanket deposited over the semiconductor substrate to a thickness of between about 4000 to 12,000 Angstroms and then planarized, for example, by chemical mechanical polishing (CMP).

Figure 9:
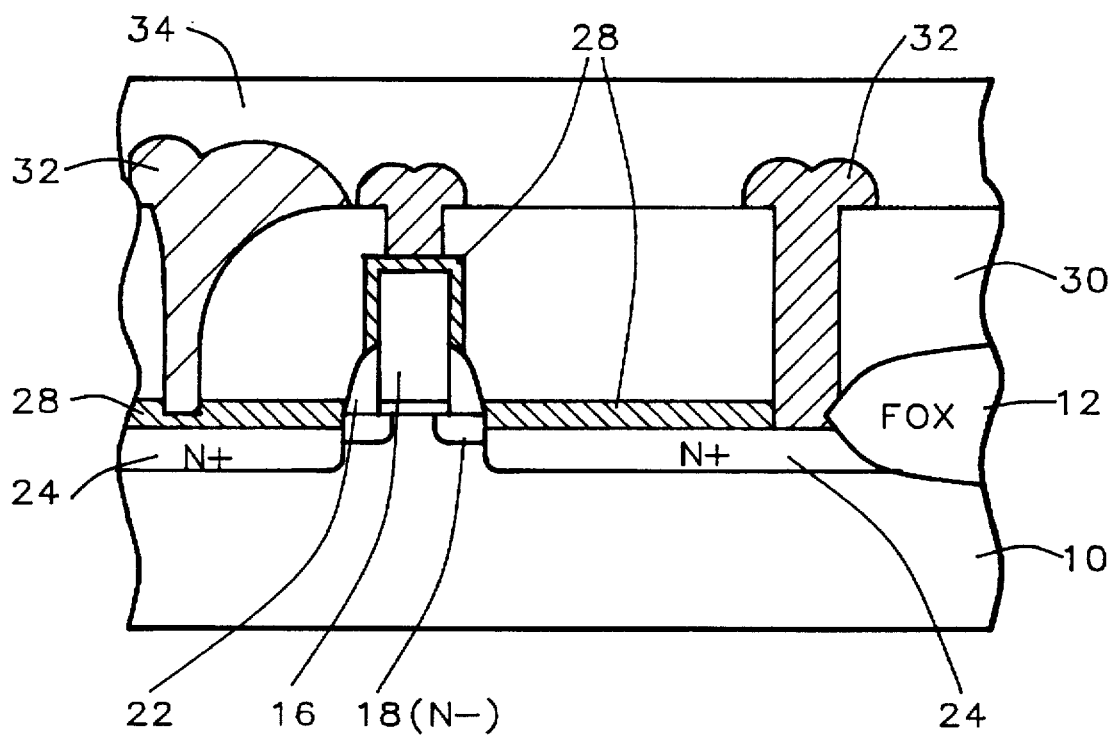
FIG. 9 schematically illustrates in cross-sectional representation a completed integrated circuit device fabricated by the process of the present invention.

The integrated circuit device is completed as is conventional in the art. For example, as illustrated in FIG. 9, openings are etched through the insulating layer and the titanium silicide layer to underlying source and drain regions and other areas where electrical contact is to be made. A conducting layer 32 is deposited and patterned to complete the electrical connections. A passivation layer 34 completes the fabrication of the integrated circuit device.

The process of the invention provides an effective method of fabricating an integrated circuit device having a silicided polysilicon gate with reduced resistance. By effectively increasing the conduction area, the series resistance, and consequently the RC delay can be reduced.

In accordance with another aspect of the present invention, an integrated circuit device having reduced resistance is described with reference to FIG. 9. A gate oxide layer 14 underlies a polysilicon gate electrode 16 having high aspect ratio of more than about 1 to 2 on a semiconductor substrate 10. Source and drain regions 24 lie within the semiconductor substrate adjacent to the gate electrode 16. Dielectric spacers 22 extend approximately halfway up the sidewalls of the gate electrode. A silicide layer 28 covers the top surface and the side surfaces of the gate electrode not covered by the spacers 22 and covers the source and drain regions 24 of the semiconductor substrate. A thick insulating layer 30 covers the semiconductor substrate and the gate electrode. A patterned conducting layer 32 extends through openings in the thick insulating layer 30 to contact the gate electrode 16 and the source and drain regions 24. A passivation layer 34 overlies the insulating layer 30 and the patterned conducting layer 32.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

growing a layer of gate silicon oxide over the surface of a semiconductor substrate;

depositing a polysilicon layer overlying said gate silicon oxide layer;

etching away said polysilicon and said gate oxide layers where they are not covered by a mask to form a gate electrode;

implanting first ions to form lightly doped regions within said semiconductor substrate using said gate electrode as a mask;

depositing a dielectric layer overlying said semiconductor substrate and said gate electrode;

anisotropically etching said dielectric layer to leave first spacers on the sidewalls of said gate electrode;

isotropically etching back said first spacers to leave second spacers extending approximately halfway up on the sidewalls of said gate electrode;

implanting second ions to form heavily doped source and drain regions within said semiconductor substrate using said gate electrode and said second spacers as a mask;

conformally depositing a layer of titanium over the surfaces of said semiconductor substrate;

first annealing said semiconductor substrate whereby said titanium layer is transformed into a titanium silicide layer except where said titanium layer overlies said second spacers;

stripping said titanium layer overlying said second spacers to leave said titanium silicide layer only on the top surface and the sidewalls of said gate electrode not covered by said second spacers and on the top surface of said semiconductor substrate overlying said source and drain regions;

second annealing said semiconductor substrate whereby said titanium silicide layer is transformed into a lower resistance phase;

depositing an insulating layer over the surface of said semiconductor substrate covering said gate electrode; and providing metallization with electrical connections to complete the fabrication of said integrated circuit device.

2. The method according to claim 1 wherein said polysilicon layer is deposited by low pressure chemical vapor deposition to a thickness of between about 1000 to 4000 Angstroms.

3. The method according to claim 1 wherein said polysilicon gate electrode has a high aspect ratio of greater than about 1 to 2.

4. The method according to claim 1 wherein said dielectric layer is deposited to a thickness of between about 1000 to 3000 Angstroms.

5. The method according to claim 1 wherein said first spacers have a width of between about 1000 to 3000 Angstroms.

6. The method according to claim 1 wherein said titanium layer is deposited to a thickness of between about 250 to 1000 Angstroms.

7. The method according to claim 1 wherein said first annealing is a rapid thermal anneal (RTA) performed in a nitrogen ambient at a temperature of between about 600° to 800° C. for between about 10 to 30 seconds.

8. The method according to claim 1 wherein said stripping of said titanium layer overlying said second spacers is done using a solution of $NH_4OH: H_2O_2: H_2O$.

9. The method according to claim 1 wherein said second annealing transforms said titanium silicide from phase C49 to said lower resistance phase C54.

10. The method according to claim 1 wherein said second annealing is a rapid thermal anneal (RTA) performed in a nitrogen ambient at a temperature of between about 800 to 900° C. for between about 10 to 30 seconds.

11. A method of forming a silicided polysilicon gate having reduced resistance in the fabrication of an integrated circuit device compared to a conventional integrated circuit device having only the top surface of a gate electrode silicided comprising:

growing a layer of gate silicon oxide over the surface of a semiconductor substrate;

depositing a polysilicon layer overlying said gate silicon oxide layer;

etching away said polysilicon and said gate oxide layers where they are not covered by a mask to form a gate electrode;

implanting first ions to form lightly doped regions within said semiconductor substrate using said gate electrode as a mask;

depositing a dielectric layer overlying said semiconductor substrate and said gate electrode;

anisotropically etching said dielectric layer to leave first spacers on the sidewalls of said gate electrode;

isotropically etching back said first spacers to leave second spacers extending approximately halfway up on the sidewalls of said gate electrode;

implanting second ions to form heavily doped source and drain regions within said semiconductor substrate using said gate electrode and said second spacers as a mask;

conformally depositing a layer of titanium over the surfaces of said semiconductor substrate;

first annealing said semiconductor substrate whereby said titanium layer is transformed into a titanium silicide layer except where said titanium layer overlies said second spacers;

stripping said titanium layer overlying said second spacers to leave said titanium silicide layer only on the top surface and the sidewalls of said gate electrode not covered by said second spacers and on the top surface of said semiconductor substrate overlying said source and drain regions wherein the effective conduction area of said titanium silicide layer on said top surface and said sidewalls of said gate electrode is greater than the conduction area of said conventional integrated circuit device having only said top surface of said gate electrode silicided;

second annealing said semiconductor substrate whereby said titanium silicide layer is transformed into a lower resistance phase and wherein said lower resistance phase and said greater effective conduction area together reduce the resistance of said integrated circuit device compared to said conventional integrated circuit device;

depositing an insulating layer over the surface of said semiconductor substrate covering said gate electrode; and providing metallization with electrical connections to complete the formation of said silicided polysilicon gate having reduced resistance in the fabrication of an integrated circuit device compared to said conventional integrated circuit device.

12. The method according to claim 11 wherein said polysilicon layer is deposited by low pressure chemical vapor deposition to a thickness of between about 1000 to 4000 Angstroms.

13. The method according to claim 11 wherein said polysilicon gate electrode has a high aspect ratio of greater than about 1 to 2.

14. The method according to claim 11 wherein said dielectric layer is deposited to a thickness of between about 1000 to 3000 Angstroms.

15. The method according to claim 11 wherein said first spacers have a width of between about 1000 to 3000 Angstroms.

16. The method according to claim 11 wherein said titanium layer is deposited to a thickness of between about 250 to 1000 Angstroms.

17. The method according to claim 11 wherein said first annealing is a rapid thermal anneal (RTA) performed in a nitrogen ambient at a temperature of between about 600° to 800° C. for between about 10 to 30 seconds.

18. The method according to claim 11 wherein said stripping of said titanium layer overlying said second spacers is done using a solution of $NH_4OH: H_2O_2: H_2O$.

19. The method according to claim 11 wherein said second annealing transforms said titanium silicide from phase C49 to said lower resistance phase C54.

20. The method according to claim 11 wherein said second annealing is a rapid thermal anneal (RTA) performed in a nitrogen ambient at a temperature of between about 800° to 900° C. for between about 10 to 30 seconds.

* * * * *